(12) United States Patent
Hsu et al.

(10) Patent No.: US 6,191,986 B1
(45) Date of Patent: Feb. 20, 2001

(54) MEMORY DEVICE WITH REDUNDANCY ARRAYS

(75) Inventors: Hui-Min Hsu, Hsinchu; Pei-Ju Cheng, Hsinchu Hsien, both of (TW)

(73) Assignee: Mosel Vitelic Inc., Hsinchu (TW)

( * ) Notice: Under 35 U.S.C. 154(b), the term of this patent shall be extended for 0 days.

(21) Appl. No.: 09/567,699

(22) Filed: May 10, 2000

(30) Foreign Application Priority Data

Aug. 11, 1999 (TW) .................................................. 88113717

(51) Int. Cl.[7] ....................................................... G11C 7/00
(52) U.S. Cl. ................ 365/200; 365/230.04; 365/230.03
(58) Field of Search .............................. 365/200–230.03, 365/230.04–225.7

(56) References Cited

U.S. PATENT DOCUMENTS 5,303,192 * 4/1994 Baba ................................ 365/230.04
5,835,424 * 11/1998 Kikukawa ............................. 365/200

* cited by examiner

Primary Examiner—A. Zarabian
(74) Attorney, Agent, or Firm—Darby & Darby

(57) ABSTRACT

A memory device with redundancy arrays, including row word lines and column selective lines respectively selected by a plurality of row address signals and column address signals. A bank includes a first block and a second block separately driven by the different logic values of the first row address signal. In addition, a plurality of pairs of odd arrays and even arrays and a plurality of corresponding spare rows and spare columns are located in the first and second blocks, wherein the odd arrays and the even arrays are separately driven by the different logic values of the second row address signal, and the other row address signals are used to select the row word lines located in the odd arrays or even arrays. If the selected row word line is a defective row, it will be replaced by one of the spare rows, and if the column selective line selected by a plurality of column address signals is a defective column, it will be replaced by one of the spare columns.

7 Claims, 5 Drawing Sheets

MEMORY DEVICE WITH REDUNDANCY ARRAYS

FIELD OF THE INVENTION

The present invention relates to a memory device with redundancy arrays. More particularly, it relates to a memory device which uses the different logic values of several particular row address signals to drive either odd arrays or even arrays of the different blocks in the same bank, so that defective rows and normal rows located in different blocks of the memory device don't have to be replaced by spare rows at the same time.

DESCRIPTION OF THE PRIOR ART

High-density memory such as dynamic random access memory arrays rely on the design of redundancy arrays to improve yields by repairing defective memory devices. Redundancy arrays generally include spare columns and spare rows. A traditional memory device with sense-sharing amplifiers SA and spare rows is shown in FIG. 1A. A plurality of row address signals, for example A0–A9, received by a memory device are decoded by the row decoders to select a corresponding row word line. Generally, a memory device is divided into a plurality of banks. Take bank 1 for example. The bank selective signal BK1 is used to select bank 1; In addition, bank 1 is further divided into two blocks such as the first block 1A and the second block 1B; each block includes $2^n$ (n≧0, n is an integer) memory arrays, spare rows that correspond to the memory arrays, and $2^n+1$ sense-sharing amplifiers SA. In case of two memory arrays MA1,MA2, the corresponding spare rows SR1(4), SR2(4) separately offer 4 spare rows for replacement.

When the row decoders XDEC1–2 decode row address signals A0–A9 and address a normal row word line, the enable signal en will enable the row decoder, one of XDEC1–2, for example XDEC1, in order to drive the normal row word line like WL1; if the row decoders XDEC1–2 decode row address signals A0–A9 and address a defective row word line, the row replace signal spr will enable one of the spare row decoders SX1–2, for example SX1, in order to drive one of the four spare rows SR1(4), which will replace the defective row.

The problem with this system is that if the row WL1 is defective only in the first block 1A, not only the first block 1A but also the normal row in the second block 1B will be replaced. That is, the repair rate for redundancy arrays is only half.

Further, a traditional memory device with sense-sharing amplifiers SA and spare columns, as shown in FIG. 1B, is generally divided into $2^n$ (n≧0, n is an integer) memory arrays, and $2^n+1$ sense-sharing amplifiers SA. Take 4 memory arrays MA5–8 for example. The column decoder YDEC decodes column address signals in order to select a column selective line CSL, wherein the column selective elements located in the sense-sharing amplifiers SA are all driven at the same time. Therefore, if the column selective line in the particular arrays like MA5, MA7 is a defective column and replaced by one of the spare columns SC, the normal columns addressed by the same column address signals in the memory arrays MA5–8 will be replaced by the spare columns SC at the same time. Therefore, the repair rate for the redundancy arrays is only half.

SUMMARY OF THE INVENTION

The present invention provides a memory device with redundancy arrays, which comprises row word lines and column selective lines respectively selected by a plurality of row address signals and column address signals. A bank has a first block and a second block, wherein the first block and the second block are separately driven by the different logic values of the first row address signal. In addition, a plurality of pairs of odd arrays and even arrays and a plurality of spare rows and spare columns corresponding to the odd arrays and the even arrays are located in the first blocks and the second blocks. The odd arrays and the even arrays are separately driven by the different logic values of the second row address signal. The other row address signals are used to select the row word lines located in the odd arrays or the even arrays. When the selected row word line is a defective row, it will be replaced by one of the spare rows; when the column selective line selected by a plurality of column address signals is a defective column, it will be replaced by one of the spare columns.

Since the first blocks and the second blocks are separately driven by the different logic values of the first row address signal, spare rows won't be used to replace the normal rows and the defective rows in the first blocks and in the second blocks at the same time. Therefore, the repair rate for the redundancy arrays is doubled.

In addition, since the odd arrays and the even arrays are separately driven by different logic values of the second row address signal, spare columns won't be used to replace the normal columns and the defective columns of the odd arrays and the even arrays at the same time. Therefore, the repair rate for the redundancy arrays is doubled.

BRIEF DESCRIPTION OF THE DRAWINGS

The present invention can be more fully understood from the following detailed description and preferred embodiment with reference to the accompanying drawing in which.

DETAILED DESCRIPTION OF THE PREFERRED EMBODIMENT OF THE INVENTION

Figure 1A:
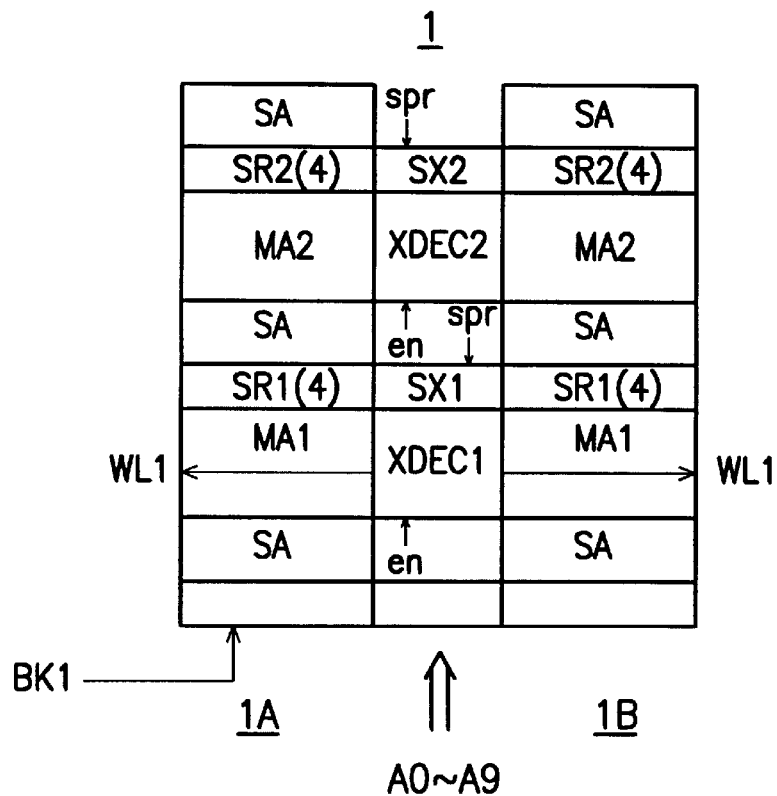
FIG. 1A is a block diagram of a conventional memory device having sense-sharing amplifiers SA and spare rows.
Figure 1B:
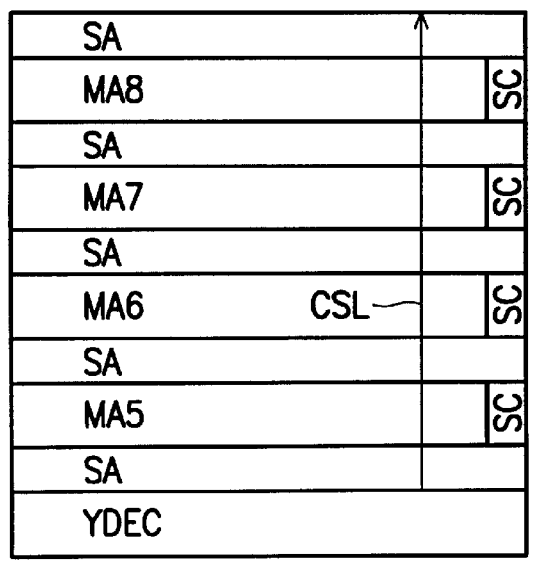
FIG. 1B is a block diagram of a conventional memory device having sense-sharing amplifiers SA and spare columns.
Figure 2A:
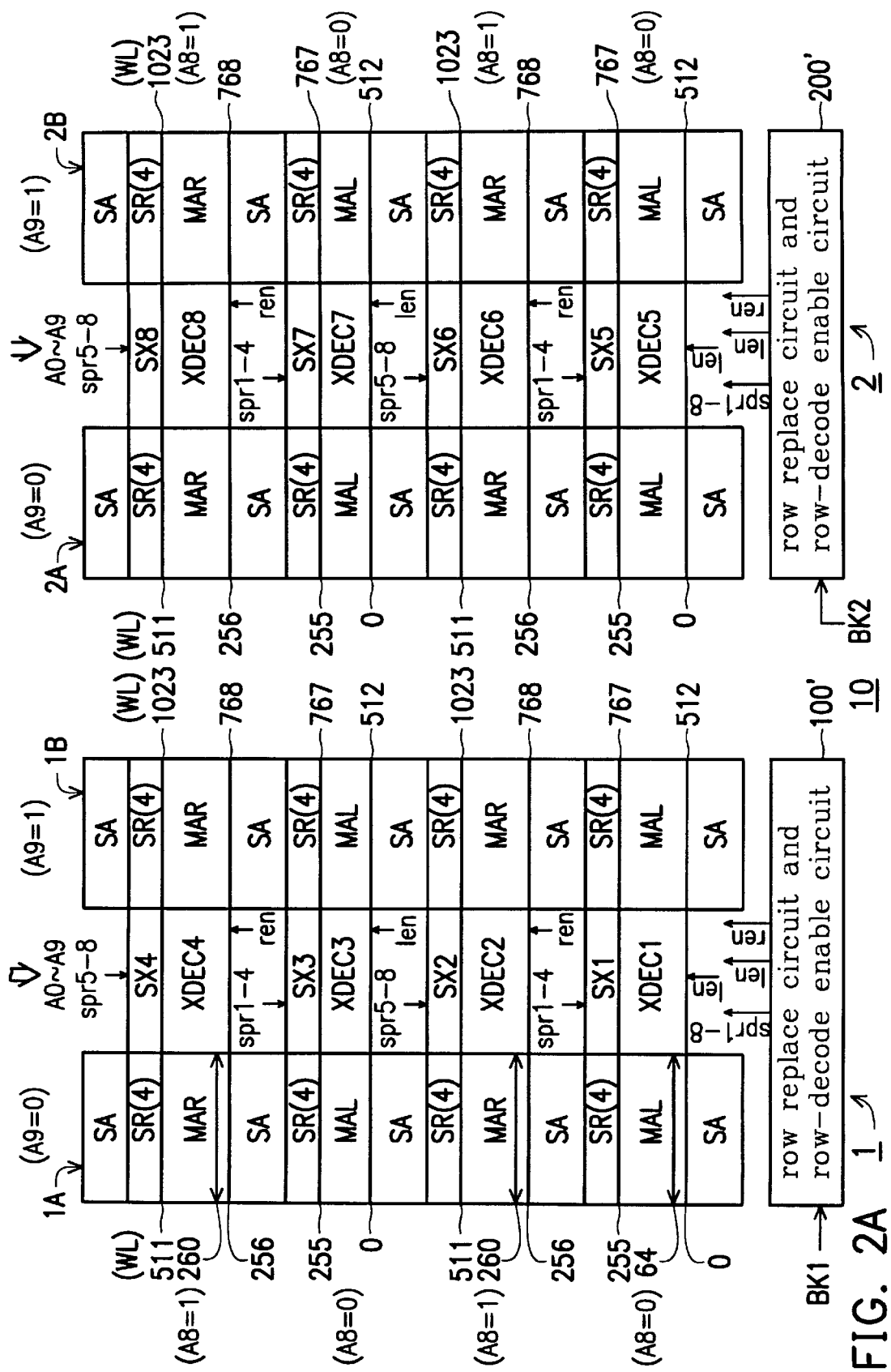
FIG. 2A is a block diagram of a memory device having sense-sharing amplifiers SA and spare rows according to one embodiment of the present invention.
Figure 2B:
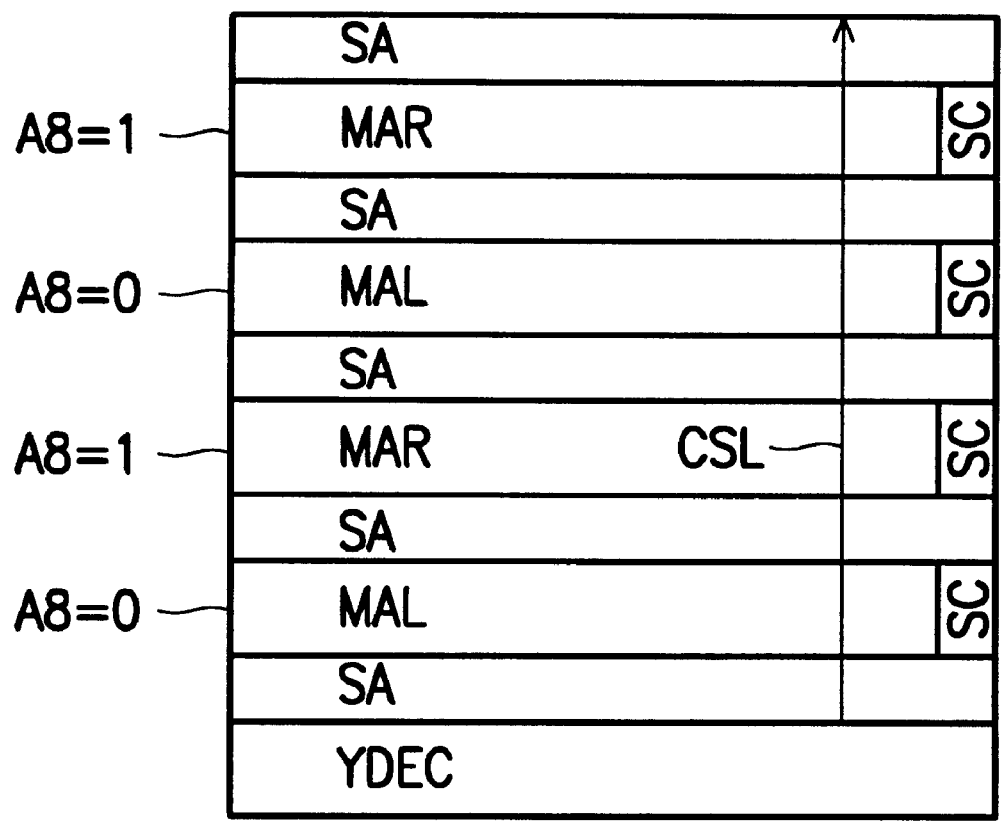
FIG. 2B is a block diagram of a memory device having sense-sharing amplifiers SA and spare columns according to one embodiment of the present invention.

Refer to FIGS. 2A and 2B, wherein a memory device with sense-sharing amplifiers SA and redundancy arrays according to one embodiment of the present invention is illustrated. In this example, a DRAM 10 is used, and the redundancy arrays include spare columns and spare rows. Element of the same function are represented by the same symbol.

First, refer to FIG. 2A. The embodiment shows the memory device 10 with spare rows, wherein a plurality of row address signals, for example row address signals A0–A9, received by the memory device are decoded by the row decoders XDEC1–8 to select a corresponding row word line.

A memory device generally has more than one bank. There are two banks in the present embodiment, the first bank 1 and the second bank 2. The bank selective signals BK1/BK2 are respectively used to select the first bank 1 and the second bank 2.

The first bank 1 is further divided into 2 blocks, the first block 1A and the second block 1B; the second bank 2 is further divided into 2 blocks, the first block 2A and the second block 2B. The first blocks 1A/2A and the second blocks 1B/2B are separately driven by the different logic values, namely 0 or 1, of the address signal A9.

Further, each block includes $2^n$ ($n \geq 0$, n is an integer) memory arrays and spare rows that correspond to the memory arrays. For example, the first blocks 1A/2A and the second blocks 1B/2B of each bank separately include a plurality of odd arrays MAL and even arrays MAR and corresponding spare rows SR(4); the corresponding spare rows SR(4) each provide four spare rows for replacement. The odd arrays MAL and the even arrays MAR are separately driven by the different logic values 0 or 1 of the row address signal A8. The other row address signals A0–A7 are used to select row word lines in the odd arrays MAL or in the even arrays MAR.

If the selected row word line WL is a defective row, it will be replaced by one of the spare rows SR(4). In the first bank 1, the first block 1A and the second block 1B are separately driven by the different logic values 0 or 1 of the row address signal A9; for the same reason, in the second bank 2, the first block 2A and the second block 2B are separately driven by the different logic values 0 or 1 of the row address signal A9. Therefore, spare rows won't replace the defective rows and the normal rows of the first block and the second block at the same time. Therefore, the repair rate for the redundancy arrays is doubled.

Refer to FIG. 2B. The figure shows a memory device with spare columns. The memory device can be divided into $2^n$ ($n \geq 0$, n is an integer) memory arrays and $2^n+1$ sense-sharing amplifiers SA. The column decoder YDEC decodes the column address signals to select a column selective line CSL. Since the odd arrays MAL and the even arrays MAR are separately driven by the different logic values 0 or 1 of the row address signal A8, the spare columns SC won't be used to replace the normal columns and the defective columns of the odd arrays MAL and the even arrays MAR at the same time. Therefore, the repair rate for the redundancy arrays is doubled.

Further, in the design of the embodiment, as shown in FIG. 2A, the different values of the address signal A9 are used to drive different blocks. For example, when A9=0, the first block 1A of the first bank 1 or the first block 2A of the second bank 2 is driven; if A9=1, the second block 1B of the first bank 1 or the second block 2B of the second bank 2 is driven.

Further, the different logic values of the address signal A8 are used to drive different memory arrays like odd arrays MAL and even arrays MAR. For example, when A8=0, odd arrays MAL are driven; if A8=1, even arrays MAR are driven.

The other row address signals A0–A7 are used to select row word lines (256 rows, in this case) of odd arrays or even arrays. Therefore, in the first block 1A in the first bank 1 and the first block 2A in the second bank 2, because A9=0, odd arrays MAL and even arrays MAR respectively have row word lines 0–255 and 256–511. And, in the second block 1B in the first bank 1 and the second block 2B in the second bank 2, because A9=1, odd arrays MAL and even arrays MAR respectively have row word lines 512–767 and 768–1023.

According to the above-mentioned, when the bank selective signal BK1 selects the first bank 1, that is, row address signals A8=1, A9=0, the row decoder XDEC2 and XDEC4 decodes the row address signals A0–A7, and one row word line like row word line 260 in the even arrays MAR of the first block 1A in the first bank 1 is driven according to row address signals A8=1, A9=0.

When the row word line selected by the row address signals A0–A9 is a normal row, the row replace circuit and the row-decode enable circuit 100'/200' will output the enable signal len of odd arrays MAL to enable the row decoders XDEC 1, XDEC3, XDEC5, XDEC7 or the enable signal ren of even arrays MAR to enable the row decoders XDEC2, XDEC4, XDEC6, XDEC8. If the row word line selected by the row address signals A0–A9 is a defective row, row replace circuit and row-decode enable circuit 100'/200' will output the replace signals spr1–4/spr 5–8 to enable one of the spare row decoders SX1,3,5,7/SX2,4,6,8 so as to drive spare rows for replacement, wherein only one of spr1–8 is output as a logic value 1 (i.e. spare row word line selected) at a time.

Take the row in row address 260 for example. When row 260 in block 1A is a defective row, the row replace circuit and row-decode enable circuit 100' will output the replace signals spr5–8 to enable the spare row decoder SX2 and SX4 so as to drive one of the spare rows SR(4) for replacement. Meanwhile, only defective row 260 of the first block 1A is replaced. However, the normal row of the second block 1B won't be replaced at the same time; that is, the repair rate is double improved in an area of the same redundancy arrays.

Figure 3:
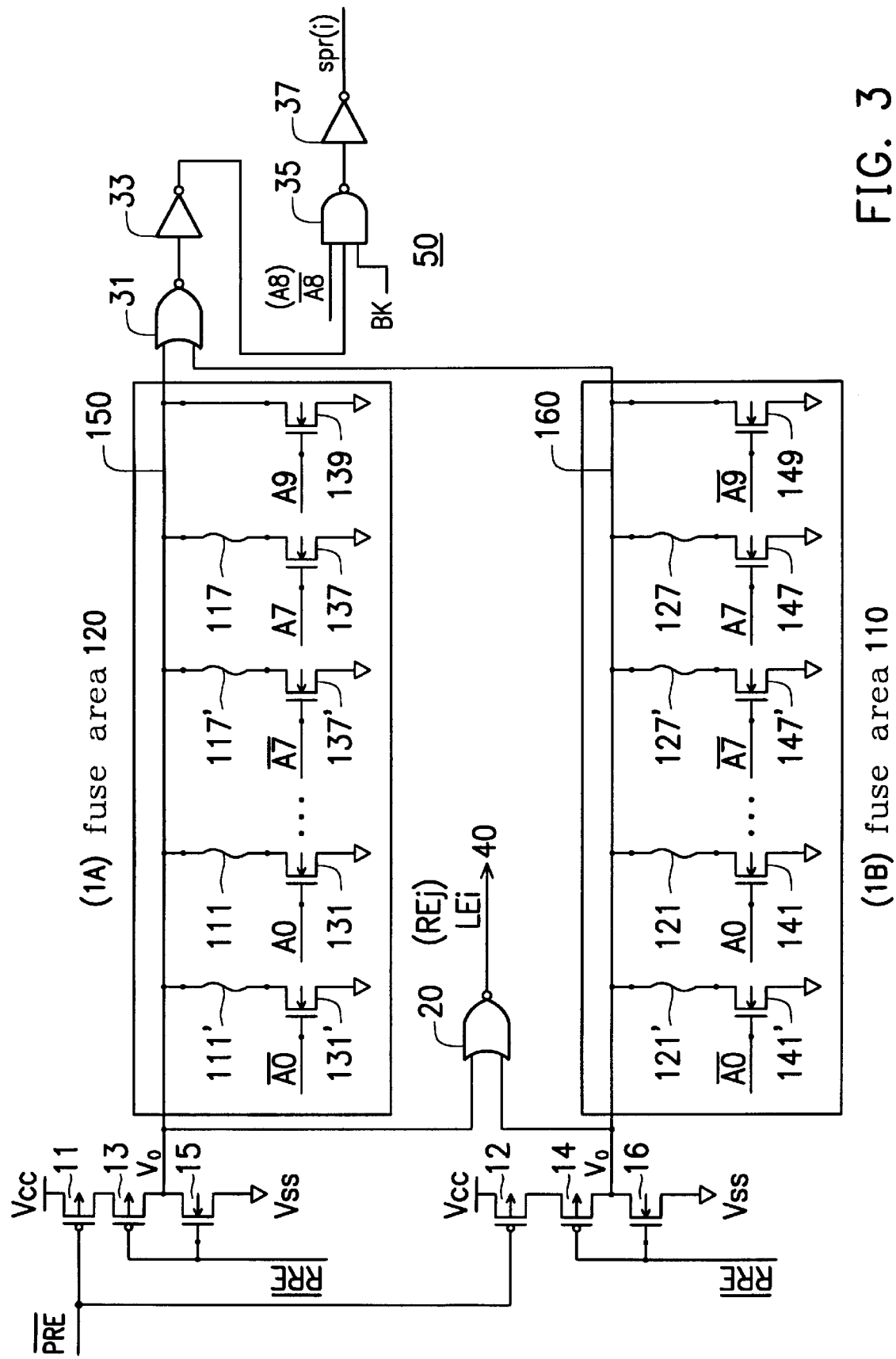
FIG. 3 is a local circuit diagram of a row replace circuit.

Refer to FIG. 3, which is a diagram of a row replace circuit 100' (200' is a duplicate copy of 100'). In the fuse area 120, the NMOS transistor 139 is for programming the block 1A of the first bank 1, wherein the input for the gate of the NMOS transistor 139 is the address signal A9, and the drain is electrically connected to the wire 150; the fuse elements 111/111' to 117/117' are for programming the row address signals A0–A7 in the block 1A of the first bank 1. The fuse elements 111/111' to 117/117' are electrically connected to the drains of the NMOS transistors 131/131' to 137/137'. The gates of the foregoing transistors are input by the address signals A0–A7 or the inverted address signals $\overline{A0}$–$\overline{A7}$.

For the same reason, in the fuse area 110, the NMOS transistor 149 is for programming block 1B of first bank 1, wherein the input for the gate of the NMOS transistor 149 is the inverted address signal $\overline{A9}$, and the drain is electrically connected to the wire 160; the fuse elements 121/121' to 127/127' are for programming the row address signals A0–A7 in the block 1B of the first bank 1. The fuse elements 121/121' to 127/127' are electrically connected to the drains of the NMOS transistors 141/141' to 147/147'; the gates of the foregoing transistors are input by the address signals A0–A7 or the inverted address signals $\overline{A0}$–$\overline{A7}$.

For example, if the defective row word line to be replaced is located in the first block 1A, the fuse area 120 in the row replace circuit is selected for programming.

In the row address signals A0–A7, if the logic value of the row address signal A0 of the defective row to be replaced is 1, the fuse device 111 will be cut off. On the other hand, if the logic value of the row address A0 of the defective row to be replaced is 0, the fuse device 111' will be cut off.

In addition, the signal $\overline{PRE}$ is a pre-charge signal electrically connected to the gates of the PMOS transistors 11/12, the sources of the PMOS transistors 11/12 are electrically connected to the power Vcc, and the drains of the PMOS transistors 11/12 are respectively electrically connected to the sources of the PMOS transistor 13/14. The signal $\overline{RRE}$ is an enable signal of the row replace circuit, which is electrically connected to the input nodes of the gates of the PMOS transistor 13/14 and the NMOS transistor 15/16 in series; the sources of the NMOS transistors 15/16 are grounded; the gate charge lines 150/160 are electrically connected to the output nodes of Vo of the PMOS transistors 13/14 and the NMOS transistors 15/16 in series, the terminals of all the fuse elements, and the drains of the NMOS transistors 139/149. When the pre-charge signal $\overline{PRE}$ and the enable signal $\overline{RRE}$ of the row replace circuit are low-level signals, the PMOS transistors 11/12 and 13/14 are on, and the NMOS transistors 15/16 are off. The charge lines 150/160 are the inputs for the NOR gates 20/31 at the same time, wherein the NOR gate 20 is electrically connected to the enable circuit 40 of FIG. 4, and the NOR gate 31 is electrically connected to the replace circuit 50.

Figure 4:
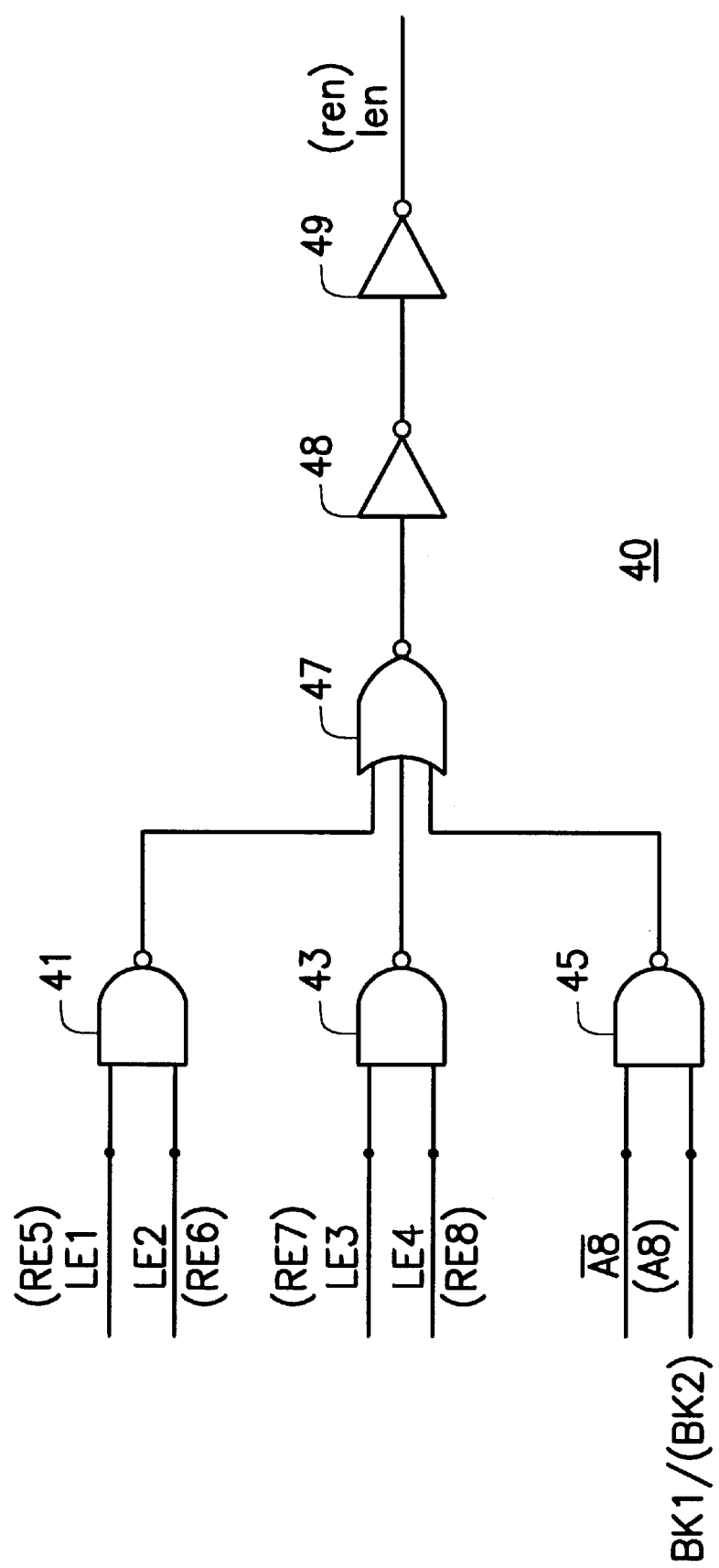
FIG. 4 is a local circuit diagram of a row-decode enable circuit.

In normal rows, when each input address signal turns on the gate of the corresponding transistor, and each fuse device in the fuse areas is not totally cut off, the charge lines 150/160 as the inputs for the NOR gate 20 will be grounded to be a level of logic 0, and therefore the Nor gate 20 will output singals (LEi/REi) of logic 1, indicating normal rows, for example LE1/LE2 or RES5/RE6, and LE3/LE4 or RE7/RE8(FIG. 4).

Reference to the row-decode enable circut 40. The inputs of the NAND gate 41 are LE1/LE2 or RES5/RE6, hte inputs of the NAND gate 45 are the bank selective singals BK1/BK2 and the inverted address signal $\overline{A8}$ or the address signal A8. When the $64^{th}$ row of the odd arrays MAL in the first block 1A of the first bank 1 is a normal row, the NAND gates 41, 43, 45 output signals of logic 0 to be the inputs of the NOR gate 47. As a result, the output of the NOR gate 47 will output hte enable signal len of logic 1 through the buffers of the inverted gates 48, 49.

Refer back to FIG. 3. In defective rows, when each input address signal turns on the gate of the corresponding transistor, and each fuse device in one of the fuse areas 110/120 is totally cut off, the charge lines 150/160 as the inputs of the NOR gate 20 will be charged to the logic 1 level of the power Vcc. The NOR gate 20 will therefore output the logic 0 signals (LEi/REi) which indicate defective rows, and the enable circuit 40 will be disabled.

In addition, the charge lines 150/160 are also the inputs of the replace circuit 50. When each fuse device in one of the fuse areas 110/120 is totally cut off and therefore the charge lines 150/160 as the inputs of the NOR gate 31 are charged to the logic 1 level of the power supply Vcc, the NOR gate 31 will output a signal of the logic 0 level, and output the logic 1 level through the inverted gate 33 to be one input of the NAND gate 35. In addition, the inputs of the NAND gate 35 further conclude the bank selective signals BK(BK1/BK2) and the address signal A8 or the inverted signal $\overline{A8}$. When the $64^{th}$ row of the odd arrays MAL in the first block 1A of the first bank 1 is a defective row (A9=0; A8=0), the bank selective signal BK1 is a logic 1 signal and the inverted signal $\overline{A8}$ is a logic 1 signal; meanwhile, the output of the NAND gate 35 outputs a replace signal spr (i) of logic 1 through the inverted gate 37.

In sum, the memory device with reduncdancy arrays in the embodiment includes a plurality of row word lines, as shown in FIG. 2A, which are selected according to the row address signals A0–A9, wherein the row address signals includes a first row address signal A9, a second row address signal A8 and other row address signals A0–A7; a plurality of column selective lines CSL, as shown in FIG. 2B, which are selected according to a plurality of column address signals; a first bank 1 and a second bank 2 each having the first block 1A/2A and the second bank 2 are respectively driven by the bank signals BK1/BK2, and the first blocks 1A/2A and the second blocks 1B/2B are separately driven by the different logic values of the first address signal A9.

In addition, according to FIGS. 2A–2B, the first blocks 1A/2A and the second blocks 1B/2B separately include a plurality of pairs of odd arrays MAL and even arrays MAR, and corresponding spare rows SR and spare columns SC.

As shown in the enable circuit 40 of FIG. 4, the row decoders XDEC 1–4/5–8 of the corresponding odd arrays MAL and even arrays MAR are separately driven according to the enable signals len/ren produced by the different values of the second address signal A8(A8=0/A8=1).

When the row word line is a defective row, according to the local circuit diagram of the row replace circuit and the row-decode enable circuit 100'/200', because the fuse device is blown out the charge lines 150/160 of the fuse areas 110/120 will be pulled tot he logic 1 level, which cooperates with the corresponding values of the bank signals BK1/BK2 and the address signals A8/$\overline{A8}$ and will make the replace circuit 50 output the replace signals spr1–4/5–8 so as to enable the corresponding spare row decoders to decode and drive spare rows for replacement. Meanwhile, the normal rows and the defective rows different blocks won't be replaced by spare rows at the same time, and therefore the repair rate is improved.

For the same reason, as shown in FIG. 2B, when defective column selective lines are selected by the column address signals and replaced by spare columns, the normal column and the defective column of odd arrays MAL and even arrays MAR won't be replaced at the same time because odd arrays MAL and even arrays MAR aren't driven at the same time, and therefore the repair rate is improved.

While the invention has been described with reference to various illustrative embodiments, the description is not intended to be construed in a limiting sense. Various modifications of the illustrative embodiments, as well as other embodiments of the invention, will be apparent to those persons skilled in the art upon reference to this description. It is therefore contemplated that the appended claims will cover any such modifications or embodiments as may fall within the scope of the invention defined by the following claims and their equivalents.

What is claimed is:

1. A memory device with redundancy arrays, comprising:

a plurality of row word lines, selected by a plurality of row address signals which include a first and a second row address signal, and other row address signals;

a plurality of column selective lines, selected by a plurality of column address signals;

a memory bank with a first block and a second block separately driven by different logic values of the first row address signal; and a plurality of pairs of odd arrays and even arrays and a plurality of spare rows and spare columns corresponding to the odd arrays and the even arrays, located in the first block and the second block, wherein the odd arrays and the even arrays are separately driven by different logic values of the second row address signal, and the other row address signals are used to select the row word lines located in the odd arrays or the even arrays;

wherein, when a selected row word lines is a defective row, it will be replaced by one of the spare rows, and if a selected column selective line is a defective column, it will be replaced by one of the spare columns.

2. The memory device as claimed in claim 1, wherein the first block and the second block are separately driven by the logic value 0 or 1 of the first row address signal.

3. The memory device as claimed in claim 1, wherein the odd arrays and the even arrays are separately driven by the logic value 0 or 1 of the second row address signal.

4. A memory device with redundancy arrays, comprising:

a plurality of row word lines, selected by a plurality of row address signals which include a first and a second row address signals, and other row address signals;

a plurality of column selective lines, selected by a plurality of column address signals;

a plurality of memory banks which each include a first block and second block separately driven by different logic values of the first row address signal; and a plurality of pairs of odd arrays and even arrays and a plurality of spare rows and columns corresponding to the odd arrays and the even arrays, located in the first block and the second block, wherein the odd arrays and the even arrays are separately driven by different logic values of the second row address signal, and the other row address signals are used to select the row word lines located in the odd array or the even array;

wherein, when a selected row word line is a defective row, it will be replaced by one of the spare rows, and if a selected column selective line is a defective column, it will be replaced by one of the spare columns.

5. The memory device as claimed in claim 4, wherein said banks are respectively selected by the bank signals of the corresponding banks.

6. The memory device as claimed in claim 4, wherein said first blocks and said blocks are separately driven by the logic value 0 or 1 of said first row address signal.

7. The memory device as claimed in claim 4, wherein said odd arrays and even arrays are separately driven by the logic value 0 or 1 of said second row address signal.

* * * * *